United States Patent
Singh et al.

(10) Patent No.: US 8,664,989 B1
(45) Date of Patent: Mar. 4, 2014

(54) METHOD TO INCREASE FREQUENCY RESOLUTION OF A FRACTIONAL PHASE-LOCKED LOOP

(71) Applicant: Cirrus Logic, Inc., Austin, TX (US)

(72) Inventors: Saurabh Singh, Austin, TX (US); Xin Zhao, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 13/761,237

(22) Filed: Feb. 7, 2013

(51) Int. Cl.
 *H03L 7/06* (2006.01)
(52) U.S. Cl.
 USPC .......................................... 327/156; 327/147
(58) Field of Classification Search
 USPC ................................................ 327/147, 156
 See application file for complete search history.

(56) References Cited

U.S. PATENT DOCUMENTS

| | | | |
|---|---|---|---|
| 5,864,572 A | 1/1999 | Bhagwan | |
| 5,912,574 A | 6/1999 | Bhagwan | |
| 8,058,942 B2 * | 11/2011 | Hammond et al. | 331/177 R |
| 2009/0115466 A1 * | 5/2009 | Maeda | 327/117 |
| 2010/0019845 A1 * | 1/2010 | Garudadri et al. | 330/207 A |
| 2010/0045498 A1 * | 2/2010 | Liu et al. | 341/143 |
| 2011/0188551 A1 * | 8/2011 | Shin et al. | 375/219 |
| 2011/0222703 A1 * | 9/2011 | Garudadri et al. | 381/74 |
| 2013/0057421 A1 * | 3/2013 | Aruga et al. | 341/143 |
| 2013/0082766 A1 * | 4/2013 | Chen | 327/557 |

* cited by examiner

*Primary Examiner* — Adam Houston
(74) *Attorney, Agent, or Firm* — Robert Platt Bell; Steven Lin

(57) ABSTRACT

The ratio of the output frequency of the PLL to the reference frequency is governed by the ratio of the feedback divider to the output divider. For the case of a fixed-point delta-sigma modulator based PLL, the feedback divide factor can only be a non-recurring/terminating rational number in base-2 (binary) system and the output divide ratio is constrained to be an integer. Hence, the range or resolution of the output frequencies that are possible is inherently limited. To solve this problem, an additional gain factor is introduced in the feedback loop. The gain factor is determined by finding an initial gain factor for which the value of the feedback divide ratio can be represented precisely in the binary format. The closest power of two larger than the initial gain factor is used as the denominator to divide the initial gain factor. The present system and method increases the resolution of such a PLL, while actually saving area/power, by introducing an additional factor within the modulator and also by not affecting the analog part of the circuit.

8 Claims, 3 Drawing Sheets

METHOD TO INCREASE FREQUENCY RESOLUTION OF A FRACTIONAL PHASE-LOCKED LOOP

FIELD OF THE INVENTION

The present invention relates to analog phase-locked loop. In particular, the present invention is directed toward a method and system to increase the frequency resolution of a fractional phase-locked loop.

BACKGROUND OF THE INVENTION

A phase-locked loop or phase lock loop (PLL) is a control system that generates an output signal $F_{out}$ having a phase that is related to the phase of an input "reference" signal $F_{ref}$. The PLL is an electronic circuit including a variable frequency oscillator and a phase detector. This circuit compares the phase of the input signal $F_{ref}$ with the phase of a signal derived from an output oscillator and adjusts the frequency of the oscillator to keep the phases matched. The signal from the phase detector is used to control the oscillator in a feedback loop.

Frequency is the time derivative of phase. Keeping the input and output phase in lock step implies keeping the input and output frequencies in lock step. Consequently, a phase-locked loop can track an input frequency, or it can generate a frequency that is a multiple of the input frequency. The former property is used for demodulation, and the latter property is used for indirect frequency synthesis.

A phase detector compares two input signals and produces an error signal, which is proportional to their phase difference. The error signal is then low-pass filtered and used to drive a voltage controlled oscillator (VCO) or a current controlled oscillator (ICO) which creates an output phase. The output is fed through an optional divider back to the input of the system, producing a negative feedback loop. If the output phase drifts, the error signal will increase, driving the VCO phase in the opposite direction so as to reduce the error. Thus the output phase is locked to the phase at the other input. This input is called the reference.

Analog phase-locked loops are generally built with an analog phase detector, a low pass filter and a VCO placed in a negative feedback configuration. A digital phase-locked loop uses a digital phase detector; the digital PLL may also have a divider in the feedback path or in the reference path, or both, in order to make the output signal frequency of the phase-locked loop a rational multiple of the reference frequency. A non-integer multiple of the reference frequency can also be created by replacing the simple divide-by-N counter in the feedback path with a programmable pulse swallowing counter. This technique is usually referred to as a fractional-N synthesizer or fractional-N phase-locked loop. A fractional phase-locked loop can generate a frequency that is a fraction of the input frequency, and such a phase-locked loop, may have uses for various electronic devices such as mobile phones and other portable devices.

The oscillator generates a periodic output signal, and the oscillator is initially assumed to be at nearly the same frequency as the reference signal. If the phase from the oscillator falls behind the phase of the reference, then the phase detector changes the control voltage of the oscillator so that it speeds up. Likewise, if the oscillator phase moves ahead of the reference phase, the phase detector changes the control voltage to slow down the oscillator. Since initially the oscillator may be far from the reference frequency, practical phase detectors may also respond to frequency differences, so as to increase the lock-in range of allowable inputs. Depending on the application, either the output of the controlled oscillator, or the control signal to the oscillator, provides the useful output of the phase-locked loop system.

A typical fixed point Δ-Σ modulator-based fractional-N phase-locked loop is illustrated in FIG. 1. Referring to FIG. 1, the phase-locked loop 100 comprises a phase-frequency detector (PFD) 110, which receives input signal $F_{ref}$ and compares the input signal $F_{ref}$ to a feedback signal from feedback divider 150. The PFD output controls current controlled oscillator (ICO) 140 such that the phase difference between the two inputs is held constant, making it a negative feedback system.

The output of PFD 110 is fed to a charge-pump (CP) 120. A charge pump phase detector 120 may have a dead band where the phases of inputs are close enough that the detector detects no phase error. For this reason, charge pump phase detectors 120 are associated with significant minimum peak-to-peak jitter, because of drift within the dead band. However these types of charge pump phase detectors 120, having outputs consisting of very narrow pulses at lock, are very useful for applications requiring very low VCO spurious outputs. The narrow pulses contain very little energy and are easy to filter out of the VCO control voltage, resulting in low VCO control line ripple and therefore low frequency modulation ("FM") sidebands on the VCO.

The output of the charge pump 120 is in turn, coupled to a loop filter (LF) 130. The PLL loop filter 130 (usually a low pass filter) generally has two distinct functions. The primary function is to determine loop dynamics, which is also called stability. This loop dynamics determination is how the loop responds to disturbances, such as changes in the reference frequency, changes of the feedback divider, or at startup. Common considerations are the range over which the loop can achieve lock (pull-in range, lock range or capture range), how fast the loop achieves lock (lock time, lock-up time or settling time) and damping behavior. Depending on the application, these considerations may require one or more of the following: a simple proportion (gain or attenuation), an integral (low pass filter), and/or derivative (high pass filter).

The output of the loop filter 130 is fed to a voltage controlled oscillator or current controlled oscillator. In this example, FIG. 1 shows a current-controlled oscillator (ICO) 140. All phase-locked loops employ an oscillator element with variable frequency capability. This oscillator element can be an analog VCO or ICO either driven by analog circuitry in the case of an analog phase-locked loop or driven digitally through the use of a digital-to-analog converter as is the case for some digital phase-locked loop designs.

The output of ICO 140 is fed to the output divider 170, which uses input signal N to control division of the output signal, to produce output signal $F_{out}$. PLLs may include a feedback divider 150 between the oscillator and the feedback input to the phase detector to produce a frequency synthesizer. A programmable divider is particularly useful in many applications, since a large number of transmit frequencies can be produced from a single stable, accurate, but expensive, quartz crystal-controlled reference oscillator.

If the feedback divider 150 in the feedback path divides by M and the reference input divider divides by N, it allows the PLL to multiply the reference frequency by M/N in a fractional PLL. It might seem simpler to just feed the PLL a lower frequency, but in some cases, the reference frequency may be constrained by other issues, and then the reference divider is useful.

The feedback is not limited to a frequency divider. This element can be other elements, such as a frequency multiplier, or a mixer. The multiplier will make the VCO/ICO output a sub-multiple (rather than a multiple) of the reference frequency. A mixer can translate the VCO/ICO frequency by a fixed offset. It may also be a combination of these elements. An example being a divider following a mixer, which allows the divider to operate at a much lower frequency than the VCO/ICO without a loss in loop gain.

As illustrated in FIG. 1, the output from ICO 140 is fed back to feedback divider 150. To obtain a fractional output ratio, the divide ratio K of the feedback divider 150 is modulated by a Δ-Σ modulator 160 according to the control input M. The output frequency $F_{out}$ is related to the input frequency $F_{ref}$ by the expression:

$$Fout = \frac{M}{N} Fref \qquad (1)$$

FIG. 1 also illustrates some example bit-widths that may be used in a fractional PLL of this type. As can be seen, the feedback divide ratio M, is represented by 6 bits for the integral part and 20 bits for the fractional part in the base-2 (binary) number system. The output divide ratio N, an integer, has been expressed using 6 bits for the integral part only. Hence, there is an inherent limitation on the reference to output frequency ratios that can be obtained using this scheme. This point is illustrated by an example as follows.

For this example, assume the reference frequency $F_{ref}$ is 12 MHz. The output frequency needed is 11.2896 MHz. This output frequency is an actual requirement for a cell phone in order to be able to support a 44.1 kHz×256 (=11.2896 MHz) mode for Time Division Multiplex, Inter-Integrated Sound (TDM/I2S) protocols, and 12 MHz is the clock signal supplied to a typical signal processing chip.

Also assume in this example that the output divide ratio is fixed to $40_{10}$, where $xx_{yy}$, implies a number xx in base yy. In this case, the feedback divide ratio M needed would be $37.632_{10}$. This ratio does not seem to be a problem, but when the number $37.632_{10}$ is converted to base-2, it yields $100101.10100001110010101100\ldots_{2}$. In other words, it is a non-terminating number in base-2. Moreover, when truncated to 20 or even 30 decimal bits, the resulting number will always have an error when compared to $37.632_{10}$. The result would be that the output frequency would be off the target frequency of 11.2896 MHz, and therefore, may lead to synchronization inaccuracy and maybe even to dropped samples when used as the main clock for TDM/I2S data transfers.

Two scenarios may seem as intuitive solutions for increasing the frequency resolution of a fractional PLL. A first approach would be to determine whether there was another value for N that can yield a terminating M. FIG. 2(a) shows the error incurred when representing M using 20 fractional bits. Clearly, there is no value of N which yields zero error in M. A second intuitive approach would be to determine if the number of fractional bits could be increased. FIG. 2(b) shows the errors in M when represented using 30 fractional bits. As can be seen, the error can be made smaller but not removed completely.

Thus, the techniques illustrated in FIGS. 2(a) and 2(b) may be used to minimize the error in the output frequency, however, they fail to eliminate the error entirely. Additionally, even though the problem was demonstrated using these particular exemplary numbers, there are numerous other cases as well which exhibit the same complication. For example, if $F_{ref}$=12 MHz and $F_{out}$=12.288 MHz, which is 48 kHz×256, this example also produces a non-terminating binary number, which when truncated, results in an error in the output frequency.

SUMMARY OF THE INVENTION

The present system and method circumvents this problem by introducing an additional factor within the delta-sigma modulator. The output frequency can be made to be exactly as desired. Moreover, the cost incurred is minimal and the analog part of the PLL generally remains the same.

The present system and method increase the output frequency resolution of a fractional-PLL by introducing an additional factor within the modulator. A typical delta-sigma modulator comprises an integrator and a quantizer, wherein the average value of K is governed by M. For the purpose of illustrating the technique, the example from the previous section is considered here again. As discussed, it is not possible to represent $37.632_{10}$ accurately in the binary domain. However, if an additional gain factor (×500) is introduced in the feedback loop, and M changed to 18816 (which can be represented precisely in binary format), the average value of K obtained would be 37.632. Arguably, even though this scheme would theoretically work, the stability of the modulator in this situation is suspect due to the high level of the input value M. To get around this problem, the gain factor can be modified to 500/512, hence achieving modulator stability. Using a gain factor of 500/512 and an input M changed to 36.75, the output K would be 37.632.

The present system and method may be generalized to solve this problem in a number of other situations. The process involves first finding a gain factor G, for which the value of M can be represented precisely in the binary format. Secondly, the closest power of two, which is larger than G, is determined and used as the denominator in the gain factor. A power of two is advisable because it may be implemented as a shift function in digital operation. Also, finding the closest value to G will ensure minimal change to the loop dynamics of the modulator itself.

The present system and method provides a number of advantages over the prior art. First, precise output frequency ensures proper functionality without any dropped samples when the generated clock is used for data transfer protocols. In audio signals in particular, dropped samples may appear as artifacts in the audio data stream and are thus not acceptable. Second, the modulator occupies about thirty percent (30%) of the total area of the PLL on a semiconductor chip, and it is desirable to reduce the overall size of the modulator. The present system and method actually saves area on a semiconductor chip by reducing the data path width required for the given accuracy by more than fifty percent (50%). The present system and method is also completely independent of the analog portion of the PLL and thus does not impact the analog portion of the PLL design. Changes to the modulator loop dynamics are thus minimal.

DETAILED DESCRIPTION OF THE INVENTION

Figure 1:
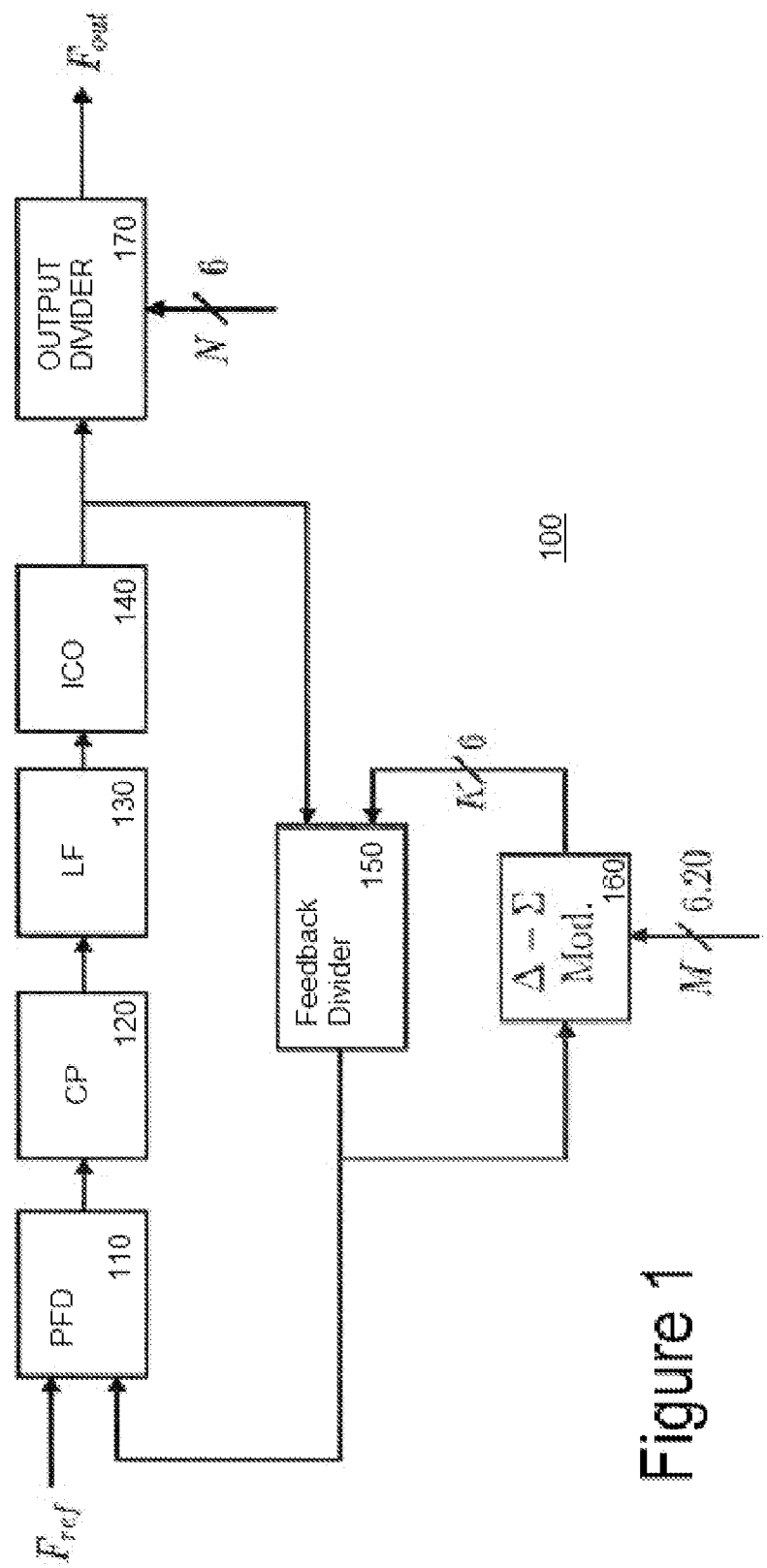
FIG. 1 is a block diagram of a typical fixed paint delta-sigma modulator-based fractional-N PLL.
Figure 2A:
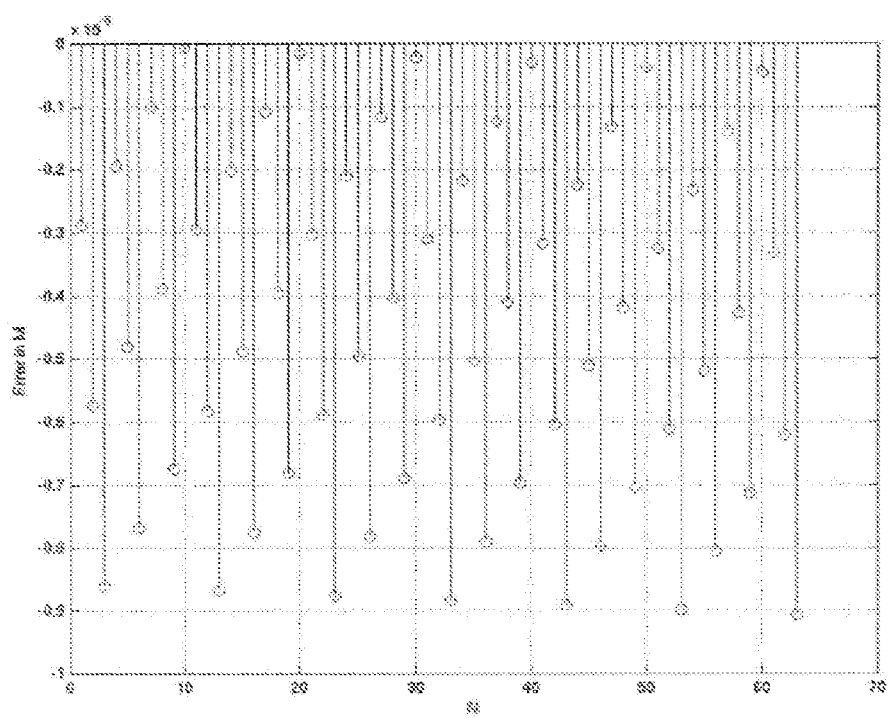
FIG. 2(a) is a graph showing the error incurred when representing M using 20 fractional bits.
Figure 2B:
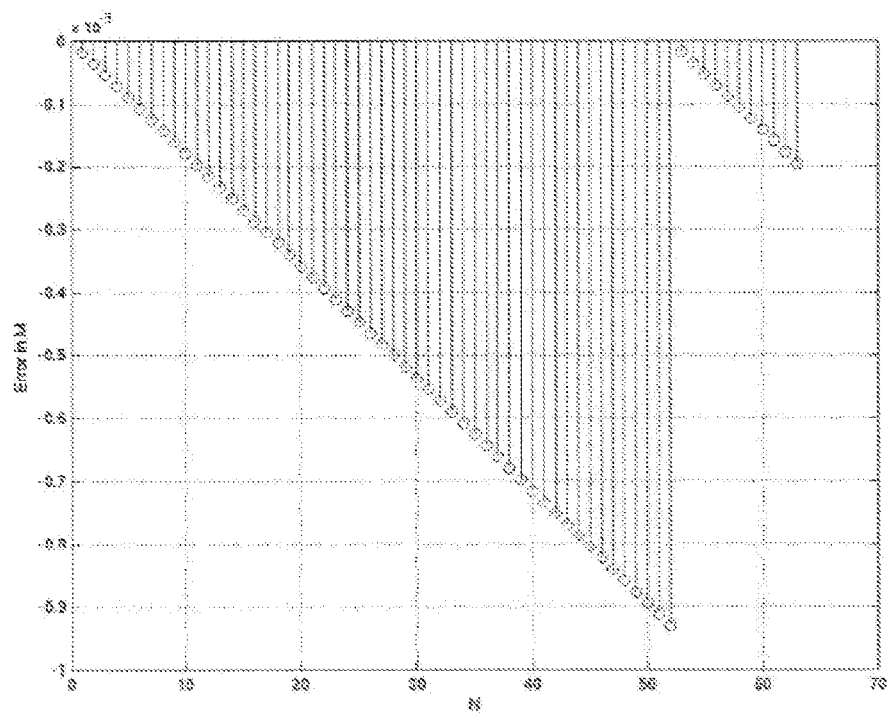
FIG. 2(b) is a graph showing the errors in M when represented using 30 fractional bits.
Figure 3A:
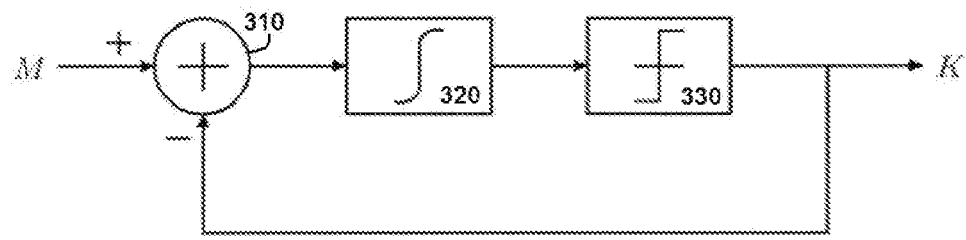
FIG. 3(a) is a simplified block diagram of a typical delta-sigma modulator, consisting of an integrator 320 and a quantizer 330, wherein the average value of K is governed by M.
Figure 3B:
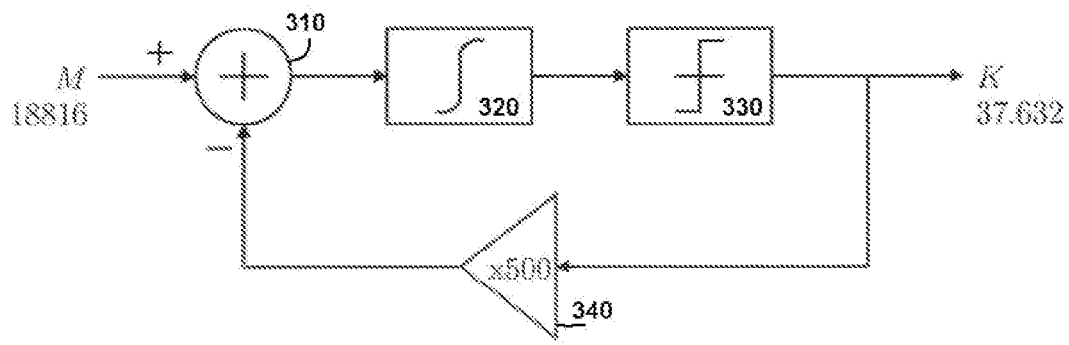
FIG. 3(b) is a simplified block diagram of a typical delta-sigma modulator, consisting of an integrator 320 and a quantizer 330, wherein the average value of K is governed by M, where an additional gain factor (×500) is introduced in the feedback loop.
Figure 3C:
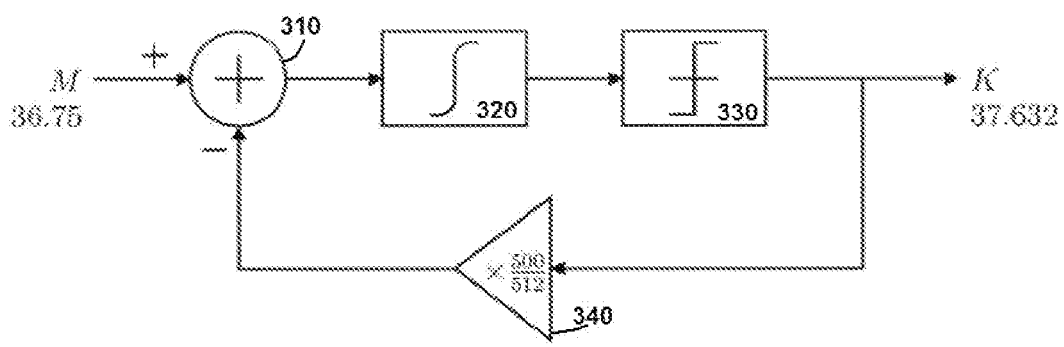
FIG. 3(c) is a simplified block diagram of a typical delta-sigma modulator, consisting of an integrator 320 and a quantizer 330, wherein the average value of K is governed by M, where an additional gain factor (×500/512) is introduced in the feedback loop.

The fixed point delta sigma (Δ-Σ) modulator based fractional-N PLL of FIG. 1 may be modified, in the present system and method, by altering the design of the—modulator portion 160 of FIG. 1. FIGS. 3(a)-3(c) illustrate three possible designs for a delta-sigma modulator, including a basic delta-sigma modulator illustrated in FIG. 3(a), a first embodiment of the present system and method in FIG. 3(b), and the preferred embodiment of the present system and method as illustrated in FIG. 3(c).

The present system and method increases the output frequency resolution of a fractional-PLL by introducing an additional factor within the delta-sigma modulator 160 of FIG. 1. FIG. 3(a) is a simplified block diagram of a typical delta-sigma modulator, consisting of an integrator 320 and a quantizer 330, wherein the average value of K is governed by M. The feedback divide ratio M is input to adder 310, which subtracts the output value K from the feedback divide ratio value M. This subtracted value from adder 310 is then fed to integrator 320, which averages the output over time. Quantizer 330 then provides a quantized output value K, which may be used to control the fractional PLL of FIG. 1.

For the purpose of illustrating the technique, consider the example from the previous section again. As discussed, it is not possible to represent $37.632_{10}$ accurately in the binary domain, using the embodiment of FIG. 3(a), as the resulting value, represented in binary form, will require too many bits and also be imprecise, resulting in a slight phase difference, and possible data loss.

However, if an additional gain factor (×500) in amplifier 340 is introduced in the feedback loop, as illustrated in FIG. 3(b), and M changed to 18846 (which can be represented precisely in binary format), the average value of K obtained would be 37.632 (i.e., 18816/500=37.632). Arguably, even though this scheme would theoretically work, the stability of the modulator in this situation is suspect.

To get around this problem, the gain factor in amplifier 340 can be modified to 500/512, hence achieving modulator stability, as illustrated in FIG. 3(c). This embodiment allows the input value M to be set to 36.75, which results in improved stability for the Δ-Σ modulator. The output K is thus 37.632 (i.e., 36.75×512/500=37.632), which provides the desired frequency value in a stable modulator design.

The present system and method may be adapted to solve this problem in a number of other situations. The process involved is fairly straightforward. First, a gain factor G is found for which the value of M can be represented precisely in the binary format. Second, the closest power of two, which is larger than G, is found and used as the denominator in the gain factor. A power of two is advisable because it may be implemented as a shift function in digital operation. Also, finding the closest value to G will ensure minimal change to the loop dynamics of the modulator itself.

There are numerous advantages of the present system and method. First, a precise output frequency ensures proper functionality without any dropped samples when the generated clock is used for data transfer protocols. Second, since the modulator occupies about thirty percent (30%) of the total area of the PLL, the present system and method actually saves area by reducing the data path width required for the given accuracy by more than fifty percent (50%). Third, the invention is completely independent of the analog part of the PLL. Finally, the changes to the modulator loop dynamics itself are minimal.

The Appendix to the present Specification includes a number of MATLAB scripts which emulate the improved delta-sigma modulator of the present system and method and validate its operation. The present system and method has been proven in silicon on a recently made product, thus validating the operation of the invention.

While the preferred embodiment and various alternative embodiments of the invention have been disclosed and described in detail herein, it may be apparent to those skilled in the art that various changes in form and detail may be made therein without departing from the spirit and scope thereof.

```
clear
clc
in_dc_val = 37.632;
junk_samples = 1000;
N = junk_samples + 2^20;
nfrac = 20;
gfac = 500;
gfac1 = 512;
in_dc = in_dc_val*ones(1,N)*gfac;
out = zeros(1,N);
xx1 = zeros(1,N);
xx2 = zeros(1,N);
xfb = zeros(1,N);
xsum = zeros(1,N);
x1 = 0;
x2 = 0;
fb = 0;
sum = 0;
dither_frac = rand(1,N);
for k = 1:N
    xx1(k) = x1;
    xx2(k) = x2;
    xsum(k) = sum;
    xfb(k) = fb;
    sum = x2+dither_frac(k);
    out(k) = floor(sum);
    fb = out(k);
    x2 = x1 - 2*fb + x2;
    err1 = (in_dc(k) - fb*gfac)/gfac1;
    x1 = err1 + x1;
end
outfft = fft(out(junk_samples+1:N));
freq1 = (0:1:N-1-junk_samples)/N-junk_samples)*12e6;
figure
plot(1:1:N,out);
figure
plot(freq1,20*log10(abs(outfft+1e-25)));
figure
pwelch(out(junk_samples+1:N),2^15,0,2^15,12e6)
clear
clc
nfrac = 20;
pos_clip_6_20 = (2^26-1)/2^20;
% neg_clip_6_20 = -pos_clip_6_20-1;
pos_clip_15_11 = (2^26-1)/2^11;
% neg_clip_15_11 = -pos_clip_15_11-1;
pos_clip_16_11 = (2^26-1)/2^11;
neg_clip_16_11 = -2^15;
pos_clip_7_20 = (2^27-1)/2^20;
neg_clip_7_20 = -2^6;
gfac_arr = [500];
gfac1_arr = [512];
idl_in_dc_val = 37.632;
in_dc_val = floor(idl_in_dc_val*gfac_arr*2^11)/2^11;
```

```
junk_samples = 1000;
samples_2powern = 20;
N = junk_samples + 2^samples_2powern;
nfrac = 20;
dither = ones(1,28);
dither_store=zeros(1,N);
out = zeros(length(gfac_arr),N);
for m = 1:length(gfac_arr)
    gfac = gfac_arr(m);
    gfac1 = gfac1_arr(m);
% in_dc_val = floor(idl_in_dc_val*gfac*2^11)/2^11;
    in_dc = in_dc_val(m)*ones(1,N);
    xx1 = zeros(1,N);
    xx2 = zeros(1,N);
    xfb = zeros(1,N);
    xsum = zeros(1,N);
    x1 = 0;
    x2 = 0;
    fb = 0;
    sum = 0;
    for k = 1:N
        xx1(k) = x1;
        xx2(k) = x2;
        xsum(k) = sum;
        xfb(k) = fb;
        dither_temp=xor(xor(xor(xor(dither(1,21),
dither(1,17)),xor(dither(1,13), dither(1,10))),xor(dither(1,6), dither(1,3)));
        dither_temp=xor(xor(dither(1,19), dither(1,5)),
xor(dither(1,2), dither(1,1)));
        %dither_temp=xor(dither(1,21), dither(1,19));
        for j=28: −1:2
            dither(1,j)=dither(1,j−1)
        end
        dither(1,1)=dither_temp;
        dither;
        dither_frac=(dither(1,19)/2+dither(1,16)/4+dither(1,10)/8+
dither(1,6)/16+dither(1,1)/32+dither(1,7)/64);
        dither_frac=(dither(1,12)/2+dither(1,16)/4+dither(1,10)/8+
dither(1,6)/8+dither(1,1)/16+dither(1,18)/32+
dither(1,12)/64+dither(1,8)/128+dither(1,3)/256);
        %dither_frac=(dither(1,17)/2+dither(1,11)/4+
dither(1,7)/8+dither(1,2)/16);
        dither_store(k)=dither_frac;
        sum = x2+dither_frac;
        out(m,k) = floor(sum);
        fb = out(m,k);
        x2 = x1 − 2*fb + x2;
        x2 = clipping(x2,pos_clip_6_20,0,'x2');
        x2 = round2fracn(x2,nfrac,'x2');
        fb1 = fb*gfac;
        fb1 = clipping(fb1, pos_clip_15_11,0,'fb1');
        fb1 = round2fracn(fb1,11,'fb1');
        err1 = in_dc(k) − fb1;
        err1 = clipping(err1,pos_clip_16_11,neg_clip_16_11,'err1');
        err1 = round2fracn(err1,11,'err1');
        err2 = err1/gfac1;
        err2 = clipping(err2,pos_clip_7_20,neg_clip_7_20,'err2');
        err2 = round2fracn(err2,20,'err2');
        x1 = err2 + x1;
        x1 = clipping(x1,pos_clip_7_20,0,'x1');
        x1 = round2fracn(x1,20,'x1');
    end
end
figure(1)
plot(1:1:N,out(1,:));
figure(2);
hold on
pwelch(out(1,junk_samples+1:N),2^(samples_2powern−4),
0,2^(samples_2powern−4),12e6)
% pwelch(out(2,junk_samples+1:N), 2^(samples_2powern−4),
0,2^(samples_2powern−4),12e6)
avgval = mean(out(1,junk_samples+1:N))
avgerrpc = (avgal − idl_in_dc_val)/idl_in_dc_val*100
clear
clc
nfrac = 20;
pos_clip_6_20 = (2^26−1)/2^20;
% neg_clip_6_20 = −pos_clip_6_20−1;
pos_clip_15_11 = (2^26−1)/2^11;
% neg_clip_15_11 = −pos_clip_15_11−1;
pos_clip_16_11_2s = (2^26−1)/2^11;
neg_clip_16_11_2s = −2^15;
pos_clip_7_20 = (2^27−1)/2^20;
% neg_clip_7_20 = −2^6;
pos_clip_7_20_2s = (2^26−1)/2^20;
neg_clip_7_20_2s = −2^6;
gfac_arr = [1 500]
gfac1_arr = [1 512]
mode = [0 1];
idl_in_dc_val = 30.72;
% in_dc_val = floor(idl_in_dc_val*gfac_arr*2^11)/2^11;
junk_samples = 1000;
samples_2powern = 22;
N = junk_samples + 2^samples_2powern;
nfrac = 20;
dither_frac = rand(1,N);
out = zeros(length(gfac_arr),N);
for m = 1:length(gfac_arr)
    gfac = gfac_arr(m);
    gfac1 = gfac1_arr(m);
    if(mode(m) == 0)
        in_dc_val = round2fracn(idl_in_dc_val*gfac,20,'in_m0');
    elseif(mode(m) == 1)
        in_dc_val = round2fracn(idl_in_dc_val*gfac,11,'in_m1');
    else
        error('Incorrect mode specified');
    end
    in_dc = in_dc_val*ones(1,N);
    xx1 = zeros(1,N);
    xx2 = zeros(1,N);
    xfb = zeros(1,N);
    xsum = zeros(1,N);
    x1 = 0;
    x2 = 0;
    fb = 0;
    sum = 0;
    % dither_frac = rand(1,N);
    for k = 1:N
        xx1(k) = x1;
        xx2(k) = x2;
        xsum(k) = sum;
        xfb(k) = fb;
        sum = x2+dither_frac(k);
        out(m,k) = floor(sum);
        fb = out(m,k);
        x2 = x1 − 2*fb + x2;
        x2 = clipping(x2,pos_clip_6_20,0,'x2');
        x2 = round2fracn(x2,nfrac,'x2');
        fb1 = fb*gfac;
        if(mode(m) == 0)
            fb1 = clipping(fb1,pos_clip_6_20,0,'fb1');
            fb1 = round2fracn(fb1,20,'fb1');
        else
            fb1 = clipping(fb1,pos_clip_15_11,0,'fb1');
            fb1 = round2fracn(fb1,11,'fb1');
        end
        err1 = in_dc(k) − fb1;
        if(mode(m) == 0)
            err1 = clipping(err1,pos_clip_7_20_2s,neg_clip_7_20_2s,'err1');
            err1 = round2fracn(err1,20,'err1');
        else
            err1 = clipping(err1,pos_clip_16_11_2s,neg_clip_16_11_2s,'err1');
            err1 = round2fracn(err1,11,'err1');
        end
        err2 = err1/gfac1;
        err2 = clipping(err2, pos_clip)_7_20_2s,neg_clip_7_20_2s,'err2');
        err2 = round2fracn(err2,20,'err2');
        x1 = err2 + x1;
        x1 = clipping(x1,pos_clip_7_20,0,'x1');
        x1 = round2fracn(x1,20,'x1');
    end
end
figure(1)
plot(1:1:N,out(1,:),'b−',1:1:N,out(2,:),'r−');
figure(2)
hold on
pwelch(out(1,junk_samples+1:N),2^(samples_2powern−4),
0,2^(samples_2powern−4),12e6)
pwelch(out(2,junk_samples+1:N),2^(samples_2powern−4),
0,2^(samples_2powern−4),12e6)
```

-continued

```
avgval = [mean(out(1,junk_samples+1:N),mean(out(2,junk_samples+1:N))]
avgerrpc = (avgal - idl_in_dc_val)/idl_in_dc_val*100
clear
clc
nfrac = 20;
pos_clip_6_20 = (2^26-1)/2^20;
% neg_clip_6_20 = -pos_clip_6_20-1;
pos_clip_15_11 = (2^26-1)/2^11;
% neg_clip_15_11 = -pos_clip_15_11-1;
pos_clip_16_11 = (2^26-1)/2^11;
neg_clip_16_11 = -2^15;
pos_clip_7_20 = (2^27-1)/2^20;
neg_clip_7_20 = -2^6;
gfac_arr = [1 500];
gfac1_arr = [1 512];
idl_in_dc_val = 30.5;
in_dc_val = floor(idl_in_dc_val*gfac_arr*2^11)/2^11;
junk_samples = 1000;
samples_2powern = 15;
n = junk_samples + 2^samples_2powern;
nfrac = 20;
out = zeros(length(gfac_arr),N);
for m = 1:length(gfac_arr)
    gfac = gfac_arr(m);
    gfac1 = gfac1_arr(m);
    % in_dc_val = floor(idl_in_dc_val*gfac*2^11)/2^11;
    in_dc = in_dc_val(m)*ones(1,N);
    xx1 = zeros(1,N);
    xx2 = zeros(1,N);
    xfb = zeros(1,N);
    xsum = zeros(1,N);
    x1 = 0;
    x2 = 0;
    fb = 0;
    sum = 0;
    dither_frac = rand(1,N);
    for k = 1:N
        xx1(k) = x1;
        xx2(k) = x2;
        xsum(k) = sum;
        xfb(k) = fb;
        sum = x2+dither_frac(k);
        out(m,k) = floor(sum);
        fb = out(m,k);
        x2 = x1 - 2*fb + x2;
        % x2 = clipping(x2,pos_clip_6_20,'x2');
        % x2 = round2fracn(x2,nfrac,'x2');
        fb1 = fb*gfac;
        % fb1 = clipping(fb1,pos_clip_15_11,0,'fb1');
        % fb1 = round2fracn(fb1,11,'fb1');
        err1 = in_dc(k) - fb1;
        % err1 = clipping(err1,pos_clip_16_11,neg_clip_16_11,'err1');
        % err1 = round2fracn(err1,11,'err1');
        err2 = err1/gfac1;
        % err2 = clipping(err2,pos_clip_7_20,neg_clip_7_20,'err2');
        % err2 = round2fracn(err2,20,'err2');
        x1 = err2 + x1;
        % x1 = clipping(x1,pos_clip_7_20,0,'x1');
        % x1 = round2fracn(x1,20,'x1');
    end
end
figure(1)
plot(1:1:N,out(1,:),'b-',1:1:N,out(2,:),'r-');
figure(2)
hold on
pwelch(out(1,junk_samples+1:N),2^(samples_2powern-4)
0,2^(samples_2powern-4),12e6)
pwelch(out(2,junk_samples+1:N),2^(samples_2powern-4)
0,2^(samples_2powern-4),12e6)
avgval = [mean(out(1,junk_samples+1:N)),mean(out(2,junk_samples+1:N))]
avgerrpc = (avgval - idl_in_dc_val)/idl_in_dc_val*100
```

We claim:

1. In a fractional phase-locked loop, a delta-sigma modulator providing increased frequency resolution, comprising:
an input receiving a feedback divide ratio value;
a subtractor receiving the feedback divide ratio value and a feedback factor and outputting the difference of the feedback divide ratio value and the feedback factor;
an integrator averaging the difference between the divide ratio value and the feedback factor and outputting an averaged value;
a quantizer receiving the averaged value from the integrator and outputting a quantized value controlling a feedback divider in the fractional phase-locked loop; and
a feedback amplifier multiplying the value quantized value by a predetermined gain factor that is used to modify a gain factor of the feedback amplifier to provide improved modulator stability and the increased frequency resolution and outputting the feedback factor to the subtractor,
wherein the predetermined gain factor is determined by:
determining an initial gain factor for which the value of the feedback divide ratio can be represented precisely in a binary format,
determining the a value having a closest power of two larger than the initial gain factor, to be used as the denominator in the gain factor, and
dividing the initial gain factor by a value having the closest power of two larger than the initial gain factor, to produce the predetermined gain factor.

2. The delta-sigma modulator of claim 1, wherein the initial gain factor is 500, the value having a closest power of two which is larger than the initial gain factor is 512, and the predetermined gain factor is 500/512.

3. In a fractional phase-locked loop, a delta-sigma modulator, providing increased frequency resolution, comprising:
an input receiving a feedback divide ratio value;
a subtractor receiving the feedback divide ratio value and a feedback factor and outputting the difference of the feedback divide ratio value and the feedback factor;
an integrator averaging the difference between the divide ratio value and the feedback factor and outputting an averaged value;
a quantizer receiving the averaged value from the integrator and outputting a quantized value controlling a feedback divider in the fractional phase-locked loop; and
a feedback amplifier multiplying the value quantized value by a predetermined gain factor that is used to modify a gain factor of the feedback amplifier to provide improved modulator stability and the increased frequency resolution and outputting the feedback factor to the subtractor,
wherein the feedback divide ratio value is determined by a desired output value for the quantized value, multiplied by the gain factor.

4. A fractional phase-locked loop having increased frequency resolution, receiving an input signal having an input signal at a first frequency and outputting an output signal having a second frequency less than the first frequency, the fractional phase-locked loop comprising:
a phase-frequency detector detecting a phase difference between the input signal frequency and a feedback signal and outputting a phase difference signal;
a loop filter filtering the output from the phase-frequency detector;
an oscillator receiving an input from the loop filter and generating an oscillator output signal having a frequency proportional to the output of the loop filter;
an output divider receiving the oscillator output signal and dividing the oscillator output signal in response to a first control input;
a feedback divider receiving the oscillator output signal and a divide ratio from a delta-sigma modulator and outputting a feedback signal to the phase frequency detector;

the delta-sigma modulator receiving the feedback divide ratio and a first control input and the output of the frequency divider and outputting a quantized value, wherein the output frequency is determined by a feedback divide ratio divided by the first control input, multiplied by the input frequency, the delta-sigma modulator comprising:
- an input receiving a feedback divide ratio value based on the feedback divide ratio;
- subtractor receiving the feedback divide ratio value and a feedback factor and outputting the difference of the feedback divide ratio and the feedback factor;
- an integrator averaging the difference between the feedback divide ratio and the feedback factor and outputting an averaged value;
- a quantizer receiving the averaged value from the integrator and outputting a quantized value controlling a feedback divider in the fractional phase-locked loop; and
- feedback amplifier multiplying the quantized value by a predetermined gain factor that is used to modify a gain factor of the feedback amplifier to provide modulator stability and the increased frequency resolution and outputting the feedback factor, wherein the predetermined gain factor is determined by:
- determining an initial gain factor for which the value of the feedback divide ratio can be represented precisely in a binary format,
- determining a value having the closest power of two larger than the initial gain factor, to be used as the denominator in the gain factor, and
- dividing the initial gain factor by the value having the closest power of two larger than the initial gain factor to produce the predetermined gain factor.

5. The fractional phase-locked loop of claim 4, wherein the initial gain factor is 500, the value having the closest power of two larger than the initial gain factor is 512 and the predetermined gain factor is 500/512.

6. A fractional phase-locked loop having increased frequency resolution, receiving an input signal having an input signal at a first frequency and outputting an output signal having a second frequency less than the first frequency, the fractional phase-locked loop comprising:
- a phase-frequency detector detecting a phase difference between the input signal frequency and a feedback signal and outputting a phase difference signal;
- a loop filter filtering the output from the phase-frequency detector;
- an oscillator receiving an input from the loop filter and generating an oscillator output signal having a frequency proportional to the output of the loop filter;
- an output divider receiving the oscillator output signal and dividing the oscillator output signal in response to a first control input;
- a feedback divider receiving the oscillator output signal and a divide ratio from a delta-sigma modulator and outputting a feedback signal to the phase frequency detector;
- the delta-sigma modulator receiving the feedback divide ratio and a first control input and the output of the frequency divider and outputting a quantized value, wherein the output frequency is determined by a feedback divide ratio divided by the first control input, multiplied by the input frequency,
- the delta-sigma modulator comprising:
  - an input receiving a feedback divide ratio value based on the feedback divide ratio;
  - subtractor receiving the feedback divide ratio value and a feedback factor and outputting the difference of the feedback divide ratio and the feedback factor;
  - an integrator averaging the difference between the feedback divide ratio and the feedback factor and outputting an averaged value;
  - quantizer receiving the averaged value from the integrator and outputting a quantized value controlling a feedback divider in the fractional phase-locked loop; and
  - feedback amplifier multiplying the quantized value by a predetermined gain factor that is used to modify a gain factor of the feedback amplifier to provide modulator stability and the increased frequency resolution and outputting the feedback factor, wherein the feedback divide ratio value is determined by a desired output value for the quantized value multiplied by the gain factor.

7. A method for providing increased frequency resolution in a delta-sigma modulator in a fractional phase-locked loop, comprising:
- subtracting a feedback factor from a feedback divide ratio value and outputting the difference of the feedback divide ratio and the feedback factor;
- averaging the difference between the feedback divide ratio and the feedback factor and outputting an averaged value;
- quantizing the averaged value from the integrator and outputting a quantized value controlling a feedback divider in the fractional phase-locked loop; and
- multiplying the quantized value by a predetermined gain factor that is used to modify a gain factor of the feedback amplifier to provide modulator stability and the increased frequency resolution and outputting the feedback factor, wherein the predetermined gain factor is determined by:
- determining an initial gain factor for which the value of the feedback divide ratio can be represented precisely in a binary format,
- determining the value having the closest power of two larger than the initial gain factor, to be used as the denominator in the gain factor, and
- dividing the initial gain factor by the value having the closest power of two larger than the initial gain factor to produce the predetermined gain factor.

8. A method for providing increased frequency resolution in a delta-sigma modulator in a fractional phase-locked loop, comprising:
- subtracting a feedback factor from a feedback divide ratio value and outputting the difference of the feedback divide ratio and the feedback factor;
- averaging the difference between the feedback divide ratio and the feedback factor and outputting an averaged value;
- quantizing the averaged value from the integrator and outputting a quantized value controlling a feedback divider in the fractional phase-locked loop; and
- multiplying the quantized value by a predetermined gain factor that is used to modify a gain factor of the feedback amplifier to provide modulator stability and the increased frequency resolution and outputting the feedback factor, wherein the feedback divide ratio value is determined by a desired output value for the quantized value, multiplied by the gain factor.

* * * * *